United States Patent [19]

Tseng

[11] Patent Number: 5,766,993
[45] Date of Patent: Jun. 16, 1998

[54] METHOD OF FABRICATING STORAGE NODE ELECTRODE, FOR DRAM DEVICES, USING POLYMER SPACERS, TO OBTAIN POLYSILICON COLUMNS, WITH MINIMUM SPACING BETWEEN COLUMNS

[75] Inventor: Horng-Huei Tseng, Hsinchu, Taiwan

[73] Assignee: Vanguard International Semiconductor Corporation, Hsin-Chu, Taiwan

[21] Appl. No.: 756,086

[22] Filed: Nov. 25, 1996

[51] Int. Cl.$^6$ .................................. H01L 21/8242
[52] U.S. Cl. .................. 438/253; 438/396; 148/DIG. 14
[58] Field of Search .......................... 438/253, 254, 438/255, 396, 397, 398; 148/DIG. 14

[56] References Cited

U.S. PATENT DOCUMENTS

| | | | |
|---|---|---|---|
| 5,444,005 | 8/1995 | Kim et al. | 438/396 |
| 5,447,882 | 9/1995 | Kim | 437/60 |
| 5,478,769 | 12/1995 | Lim | 438/255 |
| 5,508,223 | 4/1996 | Tseng | 438/253 |
| 5,552,334 | 9/1996 | Tseng | 438/254 |
| 5,604,146 | 2/1997 | Tseng | 438/253 |
| 5,656,532 | 8/1997 | Tseng | 438/253 |
| 5,681,773 | 10/1997 | Tseng | 438/396 |

*Primary Examiner*—Tuan H. Nguyen
*Attorney, Agent, or Firm*—George O. Saile; Stephen B. Ackerman

[57] ABSTRACT

A method for creating an STC structure, used for high density, DRAM designs, has been developed. The process consists of creating a storage node electrode, for the STC structure, consisting of an upper polysilicon shape, comprised of polysilicon columns, with a narrow space between polysilicon columns, and an underlying lower polysilicon shape, residing in a contact hole, and making contact to underlying transistor regions. A key feature of this invention is to create a narrow trench, in a polysilicon layer, via anisotropic etching of the polysilicon layer, using a very narrow opening in a photoresist layer, as a mask. The very narrow opening is obtained by creation of non-volatile polymer spacers, on the sides of a minimum opening in the photoresist layer. The narrow trench defines the narrow spaces between polysilicon columns, while subsequent photolithographic, and dry etching patterning, define the storage node electrode, with protruding polysilicon columns. This storage node electrode configuration results in increased surface area, via use of polysilicon columns, as well as density improvements, resulting from the use of narrow spaces between polysilicon columns.

22 Claims, 4 Drawing Sheets

5,766,993

METHOD OF FABRICATING STORAGE NODE ELECTRODE, FOR DRAM DEVICES, USING POLYMER SPACERS, TO OBTAIN POLYSILICON COLUMNS, WITH MINIMUM SPACING BETWEEN COLUMNS

BACKGROUND OF THE INVENTION

1. Field of the Invention

The present invention relates to a method used to fabricate high density, semiconductor, DRAM cells, with stacked capacitor structures, and more specifically to a fabrication process used to incr ease the surface area of a storage node e lectrode, used in the stacked capacitor structure.

2. Description of the Prior Art

Device performance and cost reductions are major objectives of the semiconductor industry. These objectives have been successfully addressed by the ability of the semiconductor industry to produce devices with sub-micron features, or micro-miniaturization. Smaller features allow the reduction in performance degrading capacitances and resistances to be realized. In addition smaller features result in a smaller chip, however maintaining the same level of integration that is acquired for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source or drain of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, resulting in less of an overlying area available for the overlying STC structure.

One method used for achieving the desired electrode surface area, and the accompanying increased capacitance, is the creation of the lower electrodes with protruding shapes of polysilicon, or polysilicon columns. This type of storage node electrode supplies the additional surface area, via the protruding polysilicon columns, without increasing the width of the storage node electrode, thus not requiring additional space. Kim, in U.S. Pat. No. 5,447,882, describes such an STC structure, comprised of a lower electrode, formed by creating protruding polysilicon shapes, or columns, via patterning of a polysilicon layer. However with the Kim invention, a minimum space between polysilicon columns is not highlighted, and therefore a process for obtaining minimum spacing between protruding polysilicon columns is not detailed. Minimum spacing between polysilicon columns is desirable when smaller STC structures are needed to satisfy greater DRAM designs.

This invention will describe a process in which a storage node electrode, or lower electrode of an STC structure is also fabricated using protruding polysilicon shapes, or columns, with a detailed process describing the attainment of storage node electrodes. However in this invention a process that allows a minimum of spacing between protruding polysilicon columns to be achieved, will be taught. The decrease in spacing between protruding polysilicon columns, allows a narrower storage node electrode to be manufactured, therefore allowing density improvements to be realized, while still benefitting, in terms of increased capacitance, from the protruding polysilicon columns. The narrower spacing between polysilicon columns, in this invention, is achieved by first applying a photoresist layer, on an underlying polysilicon layer, a polysilicon layer of which the storage node electrode will be patterned from. Subsequent exposure and development of the photoresist layer creates a minimum width opening, exposing the underlying polysilicon layer. Prior to patterning a trench in the polysilicon layer, a non-volatile polymer spacer is formed on the sides of the photoresist opening, further decreasing the width of the opening. A trench in only a top portion of the polysilicon layer is then formed using the opening in the photoresist layer, with polymer spacers, as a mask. After creation of the trench in the top portion of the polysilicon layer, the photoresist layer, and polymer spacers are removed, followed by the application of another photoresist layer, protecting the trench and the bottom portion of polysilicon in the trench. Dry etching procedures are then used to create a polysilicon storage node electrode shape, with protruding polysilicon columns, and a narrow trench in the center of this shape, between the polysilicon columns.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to create narrow spaces between polysilicon columns, of the storage node electrode, by using a very narrow opening in a photoresist layer, as a mask to create a trench in a top portion of a polysilicon layer, with the width of the trench defining the very narrow space between subsequently formed polysilicon columns.

It is yet another object of this invention to use polymer spacers on the sides of a narrow opening in a photoresist layer, to decrease the width of the opening in the photoresist layer, and provide a very narrow mask for trench patterning.

It is still yet another object of this invention to simultaneously create the final shape of the storage node electrode, containing an upper portion, with protruding polysilicon columns, with very narrow spaces between columns, and a lower portion of the storage node electrode, consisting of a polysilicon shape, contacting an underlying transistor region, via anisotropic etching procedure, using a photoresist pattern as a mask.

In accordance with the present invention a method for fabricating increased capacitance DRAM devices, via use of an STC structure, comprised of a storage node electrode with increased surface area, has been developed. A transfer gate transistor comprised of: a thin gate insulator; a polysilicon gate structure formed from an overlying, first silicon oxide layer and an underlying, first polysilicon layer; lightly doped source and drain regions; insulator spacers on the sidewalls of the polysilicon gate structure, formed from a second silicon oxide layer; and heavily doped source and drain regions; are formed on a semiconductor substrate. A second polysilicon layer is deposited, contacting the source and drain region of the transfer gate transistor. After planarization procedures are used to smooth the surface of the second polysilicon layer, a photoresist layer is applied, exposed and developed, to create a first narrow opening in the photoresist layer, exposing the top surface of the underlying, second polysilicon layer. A non-volatile spacer is formed on the sides of the narrow opening in the photoresist layer, reducing the width of the narrow opening in the photoresist layer, creating a second narrow opening, but still exposing the top surface of the underlying, second polysilicon layer. An anisotropic RIE procedure is next used to create a narrow width trench, in a top portion of the second polysilicon layer, using the second narrow hole opening, in the photoresist layer, with the non-volatile polymer spacers on the sides of the first narrow hole opening in the photoresist layer, as a mask. The space between subsequent polysilicon columns is defined by the second narrow opening. Removal of the photoresist layer, and non-volatile polymer spacer, is followed by formation of another photoresist shape, used as a mask, during an anisotropic, RIE procedure, to create the final storage node electrode shape, consisting of an upper portion containing polysilicon columns, with narrow spaces between, and a lower portion, consisting of a polysilicon shape, used to contact the underlying transistor. After removal of the photoresist pattern a capacitor dielectric layer is formed on the storage node electrode shape, followed by formation of a polysilicon upper electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a storage node electrode, comprised of polysilicon columns, with a minimum of spacing between polysilicon columns, will now be described. The transfer gate transistor, used for this DRAM device, in this invention, will be an N channel device. However the STC structure, with the increased surface area described in this invention, can also be applied to P channel, transfer gate transistor.

Figure 1:
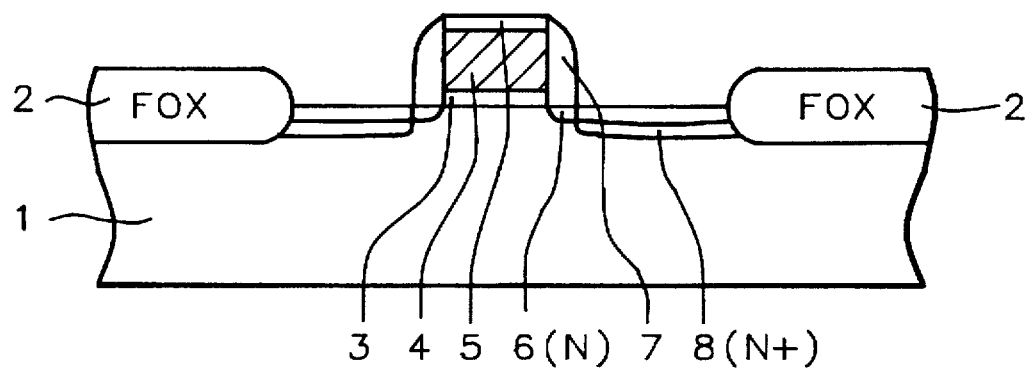
FIGS. 1–8, which schematically shows, in crosssectional style, the key fabrication stages used in the creation of a DRAM device, with a STC structure, with an increased surface area, resulting from a storage node electrode structure comprised of polysilicon columns, with narrow spaces between the polysilicon columns.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 7000° C., to a thickness between about 1500 to 4000 Angstroms. The polysilicon layer can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 600 to 1500 Angstroms. Conventional photolithographic and reactive ion etching, (RIE), procedures, using CHF$_3$ as an etchant for silicon oxide layer, 5, and using Cl$_2$ as an etchant for polysilicon layer, 4, are used to create the polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400° to 700° C., to a thickness between about 1500 to 4000 Angstroms, followed by an anisotropic RIE procedure, using CHF$_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E15 to 5E16 atoms/cm$^2$. The result of these procedures are schematically shown in FIG. 1.

Figure 2:
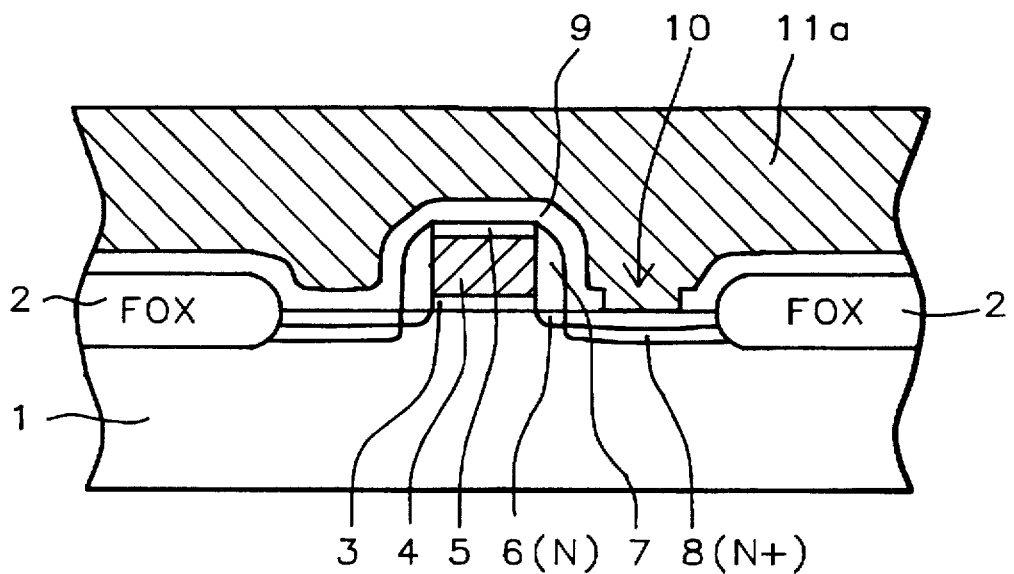

A third insulator layer of silicon oxide, 9, is next deposited via LPCVD or PECVD procedures, at a temperature between about 700° to 750° C., to a thickness between about 1500 to 3000 Angstroms. Conventional photolithographic and RIE procedures, using CHF$_3$ as an etchant, are used to open contact hole, 10, in silicon oxide layer, 9, exposing the top surface of heavily, to source region, of heavily doped source and drain region, shown schematically in FIG. 2. Photoresist removal is performed via use of plasma oxygen ashing and careful wet cleans. A second layer of polysilicon, 11a, is next deposited, via LPCVD procedures, at a temperature between about 500° to 700° C., to a thickness between about 3000 to 8000 Angstroms. The second polysilicon layer can be deposited intrinsically and doped via ion implantation of either phosphorous or arsenic, or the second polysilicon layer can be deposited using in situ doping procedures, via the addition of either phosphine or arsine, to a silane ambient. A chemical mechanical polishing, (CMP), procedure is used to planarize polysilicon layer, 11a. The result of the second polysilicon deposition, and the CMP procedure, is schematically shown in FIG. 2.

Figure 3:
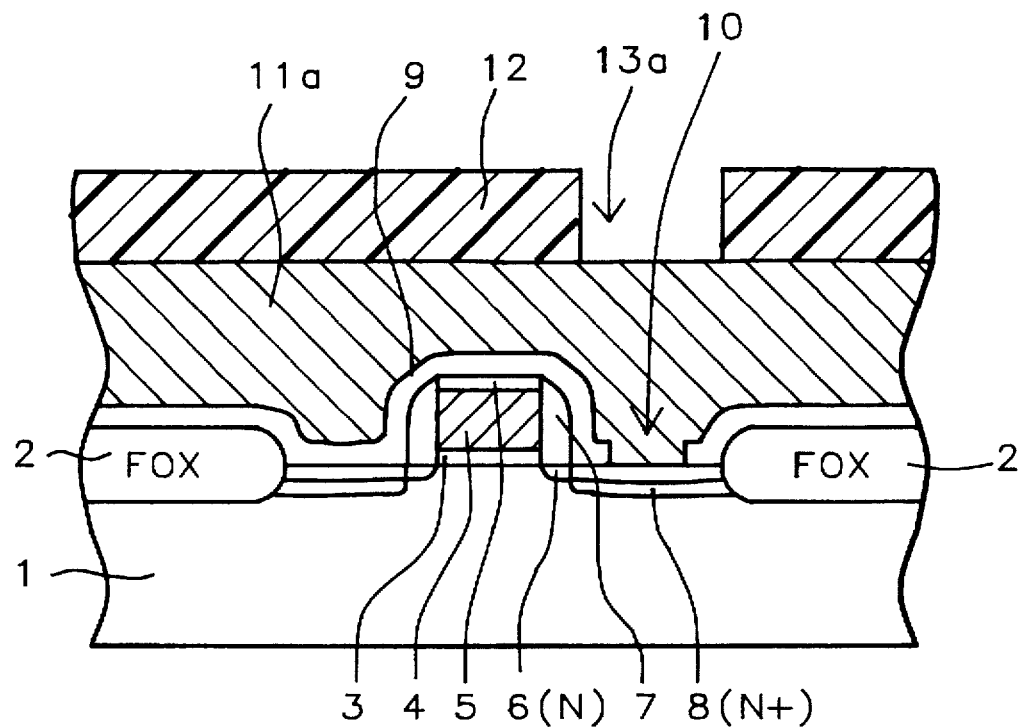
Figure 4:
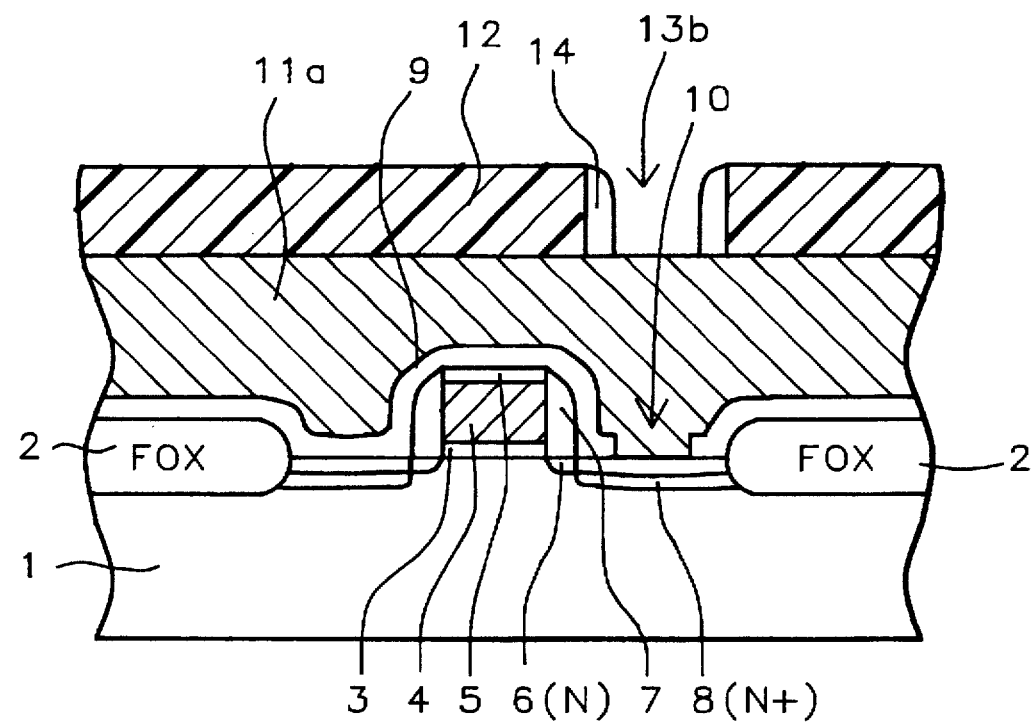

A photoresist layer, 12, is next applied, followed by exposure and development, resulting in a first narrow opening, 13a, exposing the top surface of polysilicon layer, 11a. First narrow opening, 13a, in photoresist layer, 12, with a width between about 2000 to 5000 Angstroms, is formed using the minimum dimension available via exposure using a step and repeat camera. This is shown schematically in FIG. 3. To further reduce the width of first narrow opening, 13a, in photoresist layer, 12, non-volatile polymer spacers, 14, between about 500 to 1500 Angstroms, in thickness, are formed on the sides of first narrow opening, 13a, in photoresist layer, 12, creating second narrow opening, 13b, with second narrow opening, 13b, now having a width between about 1000 to 4000 Angstroms. This width will be critical in an obtaining the desired narrow spacing between polysilicon columns, of an storage node electrode, needed to create a minimum width STC structure. This is schematically displayed in FIG. 4. Non-volatile polymer spacers, 14, are formed in the same dry etch tool, to be subsequently used for forming a trench in polysilicon layer, 11a. The non-volatile polymer spacers, are formed from photoresist reaction with either $CHF_3$, HBr, or $CHF_3$/HBr.

Figure 5:
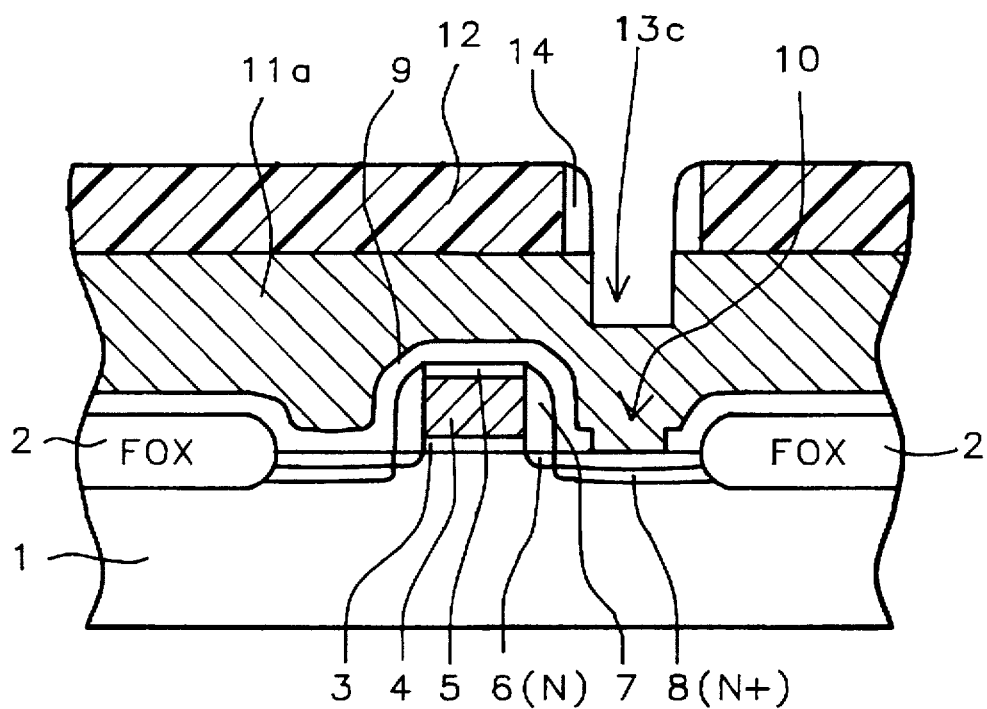

An anisotropic RIE procedure, using $Cl_2$ as an etchant, and second narrow opening, 13b, as a mask, is used to create narrow trench, 13c, in second polysilicon layer, 11a. Narrow trench, 13c, in second polysilicon layer, 11a, is created using second narrow opening, 13b, as a mask, and therefore is identical in width to second narrow hole, 13b, between about 1000 to 4000 Angstroms. The depth of narrow trench, 13c, is between about 2000 to 6000 Angstroms, below the top surface of second polysilicon layer, 11a. The surface area increase, of the subsequent storage node electrode, increases with increasing trench depth. The result of the trench formation is schematically shown in FIG. 5.

Figure 6:
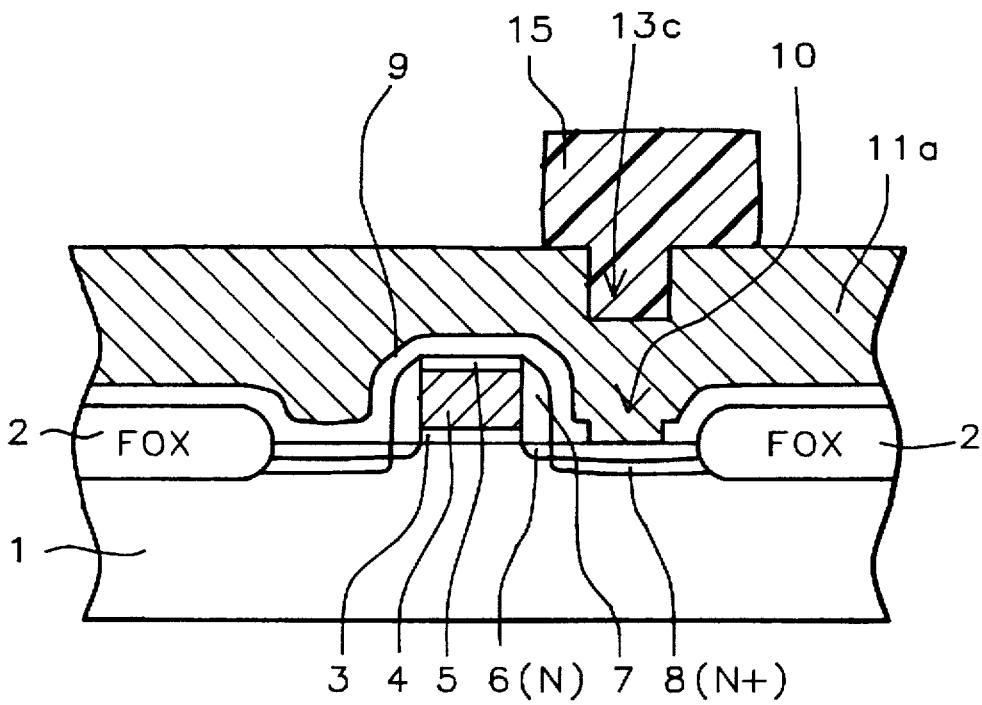
Figure 7:
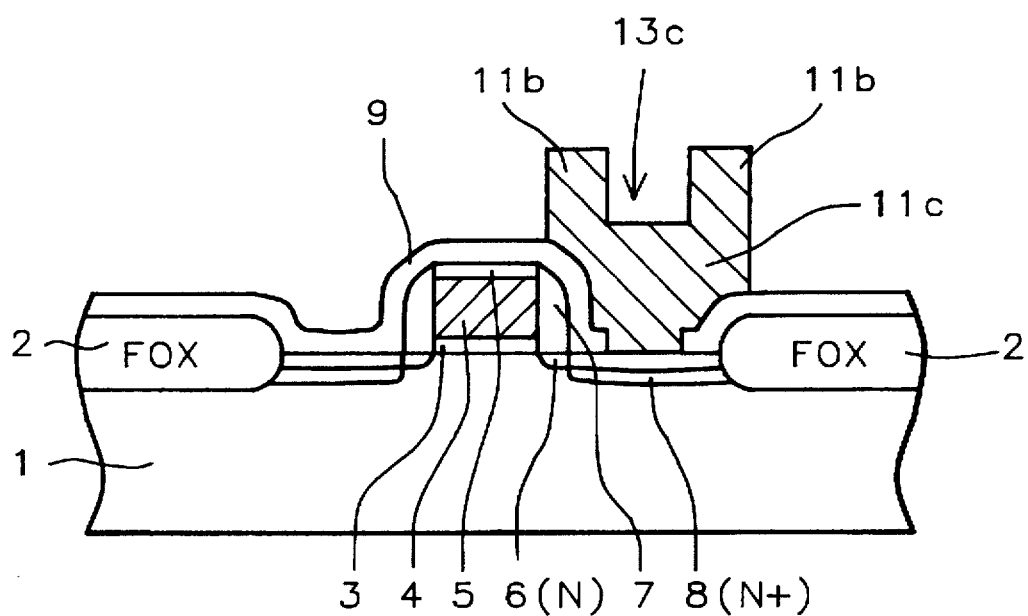

Photoresist layer, 12, as well as non-volatile polymer spacers, 14, are removed via plasma oxygen ashing, followed by careful wet cleans, and then followed by additional photolithographic procedures, producing photoresist shape, 15, shown schematically in FIG. 6. Photoresist shape, 15, is used as mask, to allow patterning of second polysilicon layer, 11a, to be performed, creating a storage node electrode shape. The patterning of second polysilicon layer, 11a, is performed via anisotropic RIE procedures, using $Cl_2$ as an etchant, resulting in a storage node electrode shape, comprised of an upper portion consisting of polysilicon columns, 11b, with a space, 13c, between polysilicon columns, 11b, formerly narrow trench, 13c, and between about 1000 to 3000 Angstroms, in width. The bottom portion of the storage node electrode, 11c, contacts the underlying, heavily doped source and drain region, 8, of the transfer gate transistor. Photoresist shape, 15, is again removed via plasma oxygen ashing, and careful wet cleans. The resulting storage node structure is schematically shown in FIG. 7.

Figure 8:
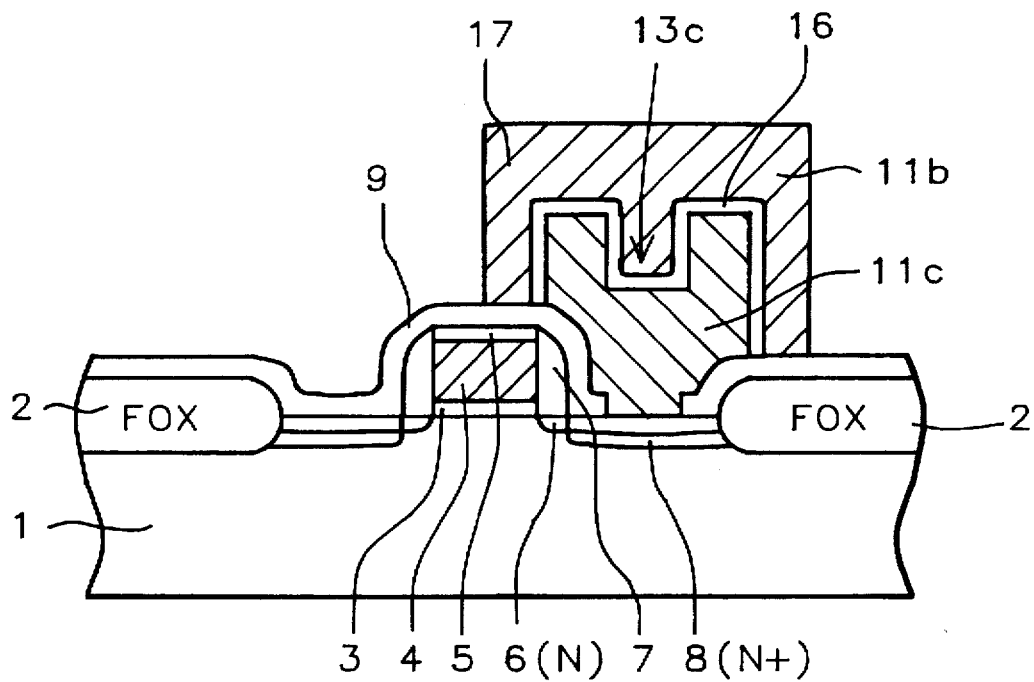

FIG. 8, schematically shows the completion of the STC structure. First a dielectric layer, 16, is formed, overlying the storage node electrode, comprised of polysilicon columns, 11b, overlying the bottom portion of second polysilicon layer, 11c. Dielectric layer, 16, can be an insulator layer possessing a high dielectric constant, such as $Ta_2O_5$, obtained via r.f sputtering techniques, at a silicon oxide equivalent thickness between about 10 to 100 Angstroms. Dielectric layer, 16, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished via in situ doping, LPCVD deposition procedures, via the addition of $PH_3$ to the silane ambient. Photolithographic and RIE procedures, using $Cl_2$ as an etchant, are next employed to create polysilicon upper electrode, or plate electrode, 17, shown schematically in FIG. 8. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, comprised of an underlying transistor; with a gate insulator, a gate electrode structure, formed from a first silicon oxide, and a first polysilicon layer, insulator sidewall spacers, formed from a second silicon oxide layer, a source and drain region, and an overlying STC structure; with a storage node electrode, a dielectric layer, and an overlying plate electrode, and with the upper portion of said storage node electrode, comprised of polysilicon columns, with a narrow space between said polysilicon columns, and extending above a lower portion of said storage node electrode, which is used for contact to a source region of said source and drain region, of said underlying transistor, comprising the steps of:

depositing a third silicon oxide layer on said underlying transistor, of said DRAM device;

opening a contact hole, in said third silicon oxide layer, to expose top surface of a source region, of said source and drain regions, of said underlying transistor;

depositing a second polysilicon layer on top surface of said third silicon oxide layer, and on top surface of said source and drain regions, exposed in said contact hole;

planarization of said second polysilicon layer;

applying a first photoresist layer on said second polysilicon layer;

forming a first narrow opening, in said first photoresist layer, with the width of said first narrow opening between about 2000 to 5000 Angstroms, exposing the top surface, of a first region, of said second polysilicon layer;

selectively forming non-volatile polymer spacers with a thickness between about 500 to 1500 Angstroms, on the sides of said first narrow opening, in said first photoresist layer, creating a second narrow opening, in said first photoresist layer, with the width of said second narrow opening between about 1000 to 4000 Angstroms, and exposing the top surface, of a second region, of said second polysilicon layer, smaller in width then the width of said first region, of said second polysilicon layer;

anisotropic etching of a top portion of said second region, of said second polysilicon layer, using said second narrow opening as a mask, to create a narrow trench, between about 2000 to 6000 Angstroms in depth, and between about 1000 to 4000 Angstroms in width, in top portion of said second polysilicon layer;

removal of said first photoresist layer, and of said non-volatile polymer spacers;

applying a second photoresist layer on said top surface of said second polysilicon layer, and on said second polysilicon layer, of said narrow trench;

forming a photoresist shape, from said second photoresist layer, overlying and covering said narrow trench, and also overlying and covering a portion of top surface, of said second polysilicon layer, adjacent to said narrow trench, to be used to define said polysilicon columns;

anisotropic etching of said second polysilicon layer, not covered by said photoresist shape to create said storage node electrode, comprised of: said upper portion of said storage node electrode, with said polysilicon columns, and with a narrow space between said polysilicon columns, equal in width to width of said narrow trench; and comprised of said lower portion of said storage node electrode, with a bottom portion of said second polysilicon layer, in said contact hole, underlying said polysilicon columns, contacting said source and drain region of said underlying transistor;

removal of said photoresist shape;

forming said dielectric layer on said storage node electrode;

depositing a third polysilicon layer on said dielectric layer; and patterning of said third polysilicon layer to form said plate electrode of said STC structure.

2. The method of claim 1, wherein said third silicon oxide layer is deposited using LPCVD or PECVD procedures, at a temperature between about 700° to 750° C., to a thickness between about 1500 to 3000 Angstroms.

3. The method of claim 1, wherein said contact hole is formed in said third silicon oxide layer, via RIE procedures, using $CHF_3$ as an etchant.

4. The method of claim 1, wherein said second polysilicon layer is deposited using LPCVD procedures, at a temperature between about 500° to 700° C., to a thickness between about 3000 to 8000 Angstroms.

5. The method of claim 1, wherein said non-volatile polymer spacers are formed on the sides of said first narrow opening, in said first photoresist layer, in a dry etch tool, using either $CHF_3$, HBr, or $CHF_3$/HBr, to a thickness between about 500 to 1500 Angstroms.

6. The method of claim 1, wherein said narrow trench, in top portion of said second region of said second polysilicon layer, is formed via anisotropic RIE procedures, using $Cl_2$ as an etchant, to a depth between about 2000 to 6000 Angstroms, and with said narrow trench having a width between about 1000 to 4000 Angstroms.

7. The method of claim 1, wherein said storage node electrode is formed via patterning of said second polysilicon layer, using anisotropic RIE procedures, and using $Cl_2$ as an etchant.

8. The method of claim 1, wherein the space between said polysilicon columns, is between about 1000 to 3000 Angstroms.

9. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

10. The method of claim 1, wherein said dielectric layer is $Ta_2O_5$, obtained via r.f. sputtering techniques, at a thickness between about 10 to 100 Angstroms.

11. The method of claim 1, wherein said third polysilicon layer, used for creation of said plate electrode of said STC structure, is deposited using LPCVD procedures, at a temperature between about 500° to 700° C., to a thickness between about 1000 to 2000 Angstroms.

12. A method of fabricating a stacked capacitor structure, (STC), for a DRAM device, in which the surface area of the storage node electrode is increased via use of a storage node electrode configuration, consisting of an upper portion of said storage node electrode, comprised of polysilicon columns, with a narrow space between said polysilicon columns, and with said polysilicon columns extending above the top surface of a lower portion of said storage node electrode, with said lower portion of said storage node electrode residing in a contact hole, and contacting a region of an underlying transistor, comprising the steps of:

depositing a first silicon oxide layer on said underlying transistor;

opening a contact hole in said first silicon oxide layer, to expose top surface of said region of underlying transistor;

depositing a first polysilicon layer on top surface of said first silicon oxide layer, and on said top surface of said underlying transistor region, exposed in said contact hole;

planarization of said first polysilicon layer;

applying a first photoresist layer;

forming a first narrow opening, between about 2000 to 5000 Angstroms in width, in said first photoresist layer, exposing the top surface of a first region of said first polysilicon layer;

selectively forming non-volatile polymer spacers, at a thickness between about 500 to 1500 Angstroms, on the sides of said first narrow opening, in said first photoresist layer, creating a second narrow opening, with a width between about 1000 to 4000 Angstroms, in said first photoresist layer, and exposing the top surface of a second region of said first polysilicon layer, smaller in width then the width of said first region of said first polysilicon layer;

anisotropic etching of a top portion, of said second region, of said first polysilicon layer, exposed in said second narrow opening, using $Cl_2$ as an etchant, to create a narrow trench, with a width between about 1000 to 4000 Angstroms, and to a depth between 2000 to 6000 Angstroms, in top portion, of said second region, of said first polysilicon layer, leaving underlying bottom portion of said first polysilicon layer, in said contact hole, unetched;

removal of said first photoresist layer, and removal of said non-volatile polymer spacers;

applying a second photoresist layer on top surface of said first polysilicon layer, and on said first polysilicon layer, exposed in said narrow trench;

forming a photoresist shape, from said second photoresist layer, overlying and covering said narrow trench, and overlying and covering a portion of the top surface of said first polysilicon layer, adjacent to said narrow trench, to be used to define said polysilicon columns;

anisotropic etching of said first polysilicon layer, not covered by said photoresist shape, to create said storage node electrode, comprised of: said upper portion of said storage node electrode, consisting of said polysilicon columns, with a narrow space between said polysilicon columns, equal in width to the width of said second narrow hole; and comprised of said lower portion of said storage node electrode, consisting of said bottom portion of said first polysilicon layer, in said contact hole, underlying said polysilicon columns, and contacting said region of underlying transistor;

removal of said photoresist shape;

forming a dielectric layer on top surface of said storage node electrode;

depositing a second polysilicon layer on said dielectric layer; and patterning of said second polysilicon layer to form plate electrode, of said STC structure.

13. The method of claim 12, wherein said first silicon oxide layer is deposited using LPCVD or PECVD procedures, at a temperature between about 700° to 750° C., to a thickness between about 1500 to 3000 Angstroms.

14. The method of claim 12, wherein said contact hole is formed in said first silicon oxide layer, via RIE procedures, using $CHF_3$ as an etchant.

15. The method of claim 12, wherein said first polysilicon layer is deposited using LPCVD procedures, at a temperature between about 500° to 700° C., to a thickness between about 3000 to 8000 Angstroms.

16. The method of claim 12, wherein said non-volatile polymer spacers are formed on the sides of said first narrow opening, in said first photoresist layer, in a plasma dry etch tool, using either $CHF_3$, HBr, or $CHF_3$/HBr, with photoresist, to a thickness between about 500 to 1500 Angstroms.

17. The method of claim 12, wherein said storage node electrode is formed from said first polysilicon layer, via anisotropic RIE procedures of said first polysilicon layer, using $Cl_2$ as an etchant.

18. The method of claim 12, wherein the space between said polysilicon columns is between about 1000 to 3000 Angstroms.

19. The method of claim 12, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

20. The method of claim 12, wherein said thin dielectric layer is $Ta_2O_5$, deposited using r.f. sputtering procedures, to a thickness between about 10 to 100 Angstroms.

21. The method of claim 12, wherein said second polysilicon layer is deposited using LPCVD procedures, at a temperature between about 500° to 700° C., to a thickness between about 1000 to 2000 Angstroms.

22. The method of claim 12, wherein said plate electrode is created via RIE of said second polysilicon layer, using $Cl_2$ as an etchant.

* * * * *